, 112,532, 4: NumberPatent[11]Patent StatesUnited[19]
Nakahira et al.                                                 [45] Date of Patent:    Jul. 30, 1985

[54] PROCESS FOR PRODUCING ANTIMONY TRIOXIDE HAVING A LOW ALPHA-RAY STRENGTH

[75] Inventors: Hiroshi Nakahira, Koganei; Shigeki Kubo, Niihama, both of Japan

[73] Assignee: Sumitomo Metal Mining Company Limited, Tokyo, Japan

[21] Appl. No.: 612,256

[22] Filed: May 21, 1984

[30] Foreign Application Priority Data

May 24, 1983 [JP] Japan ................................. 58-89960

[51] Int. Cl.$^3$ .............................................. C01B 29/00
[52] U.S. Cl. ...................................... 423/87; 423/617
[58] Field of Search ................................. 423/617, 87

[56] References Cited

U.S. PATENT DOCUMENTS 3,998,940 12/1976 Shafer ................................. 423/617
4,391,792  7/1983 Bloise et al. ........................ 423/617

FOREIGN PATENT DOCUMENTS 40166 12/1970 Japan ................................... 423/617

OTHER PUBLICATIONS

Kirk–Othmer, *Encyclopedia of Chemical Technology*, Third Edition, vol. 3, pp. 110, 111, John Wiley & Sons, (1978).

*Primary Examiner*—John Doll
*Assistant Examiner*—Wayne A. Langel
*Attorney, Agent, or Firm*—Watson, Cole, Grindle & Watson

[57] ABSTRACT

At least an equivalent amount of concentrated hydrochloric acid is added to antimony trioxide containing a substance emitting alpha rays, and they are stirred. Any undissolved residue is removed to prepare an aqueous solution of antimony chloride. Water is added to the solution, or a distillate obtained by distilling it at a temperature of at least 135° C. The quantity of the water is at least 10 times by volume as much as the solution, or at least 20 times by volume as much as the distillate. The solution or distillate and the water are stirred at a temperature of at least 60° C. to cause precipitation of antimony trioxide, and the precipitate is separated by filtration. The precipitate is washed with at least 10 times by weight as much warm water having a temperature of 60° C., and dried. This antimony trioxide has an alpha-ray strength not exceeding 0.01 C/cm$^2$ per hour, does not contain more than 1 ppm of any impurities such as arsenic, lead or soluble chlorine, and has a large average particle size.

14 Claims, No Drawings

PROCESS FOR PRODUCING ANTIMONY TRIOXIDE HAVING A LOW ALPHA-RAY STRENGTH

BACKGROUND OF THE INVENTION

Field of the Invention

This invention relates to a process for producing antimony trioxide having a low alpha-ray strength.

It has recently been discovered that highly integrate circuits which are packaged in materials which emit alpha rays can become damaged by these alpha rays. In fact, they can become so damaged that they will not operate properly. Materials which are normally used to package highly integrate circuits and which emit alpha rays include metals, ceramics and plastics. Plastics such as epoxy resins are most often used because they are the least expensive.

With regard to the foregoing, because the plastic materials which are used to package the highly integrated circuits must be resistant to fire, they usually include antimony trioxide, which is a flame retardant substance.

The antimony trioxide which is used for this purpose usually has an alpha-ray strength of, say, 0.1 to 0.5 C (counts)/cm$^2$ per hour. In the event that antimony trioxide is added to the plastic used for packaging a highly integrated circuit, it is necessary to reduce its alpha-ray strength to a level not exceeding 0.1 C/cm$^2$ per hour. Further reductions will undoubtedly be desired in the future.

Such antimony trioxide has hitherto been produced by melting and oxidizing antimony sulfide ores at a temperature of 900° C. to 1000° C., as disclosed, for example, in French Pat. No. 428,708, issued on Sept. 6, 1911. This method, however, fails to completely remove elements causing alpha-decay, such as uranium or thorium, which exist in a very small quantity in the ores. Those elements remain responsible for the emission of alpha rays by antimony trioxide.

SUMMARY OF THE INVENTION

It is an object of this invention to provide a process for producing antimony trioxide having a very low alpha-ray strength from antimony trioxide having an alpha-ray strength of, say, 0.1 to 0.5 C/cm$^2$ per hour.

This object is attained by dissolving antimony trioxide having an alpha-ray strength of 0.1 C/cm$^2$ per hour or above in an excess of concentrated hydrochloric acid and either hydrolyzing the solution or distilling the solution and then hydrolyzing the distillate. The hydrolyzed product has a very low alpha-ray strength, i.e., not exceeding 0.01 C/cm$^2$ per hour.

DETAILED DESCRIPTION OF THE INVENTION

According to this invention, antimony trioxide containing a substance emitting alpha rays is dissolved in at least an equivalent quantity of concentrated hydrochloric acid, and preferably, about one liter (35% by weight) of concentrated hydrochloric acid is used for dissolving 300 to 400 g of antimony trioxide. The quantity of hydrochloric acid to be used is so determined as to enable the preparation of a solution containing at least 100 g of hydrochloric acid per liter. A propeller stirrer may, for example, be used when dissolving the antimony trioxide, and the solution is separated by, for example, decantation from any undissolved residue. A sufficient quantity of water is added to the undissolved residue to hydrolyze the remaining antimony trioxide. The hydrolyzed product is separated by filtration and recovered by a furance, while the filtrate is transferred for waste disposal after neutralization by, for example, lime.

The aqueous antimony chloride solution thus obtained is hydrolyzed directly or after refining by distillation. This is achieved by adding at least 10, or preferably at least 15, times by volume as much water, and if the solution is refined by distillation, at least 20 times by weight as much water, or preferably 25 to 30 times by weight as much warm water. The solution is stirred for about an hour at a temperature of at least 60° C., or preferably at least 90° C., whereby antimony trioxide is precipitated. The precipitate is separated by filtration, preferably after it has been washed at least twice under stirring with at least 10 times by weight as much water at a temperature of at least 60° C. The separated product is dried in a vacuum at a temperature of 60° C. to 80° C., or dried at a temperature of about 100° C.

Water and hydrochloric acid are first distilled at a temperature of 100° C. to 110° C. from the antimony chloride solution, while hardly no antimony chloride is obtained during the beginning of the distillation. If water and hydrochloric acid have been distilled off almost completely, the amount of antimony chloride begins to show a gradual increase and the temperature of the liquid and gaseous phases rises to a level of 200° C. to 230° C. which is close to the temperature at which the volatilization of antimony chloride takes place at atmospheric pressure. This temperature does not show any appreciable drop as long as the liquid phase exists. The behavior which the antimony chloride solution shows during its distillation, as hereinabove described, appears to teach that in order to obtain antimony chloride of high purity, it is better to collect the distillate which is obtained at as high a temperature as possible. This, however, means a low yield and an economical disadvantage. Extensive researches have, therefore, been made, and the results thereof indicate that the recovery of the distillate obtained at a temperature not lower than 135° C. satisfies both of the requirements for a reasonably high yield and for a reduction in the amount of alpha rays emitted from antimony chloride. The separation of antimony chloride from any other product of distillation is easy to accomplish if the receptacle is changed to one for collecting antimony chloride. The receptacle in which antimony chloride has been collected had better be heated so that it may not solidify. If required, a small quantity of water is added to the distillate to obtain an aqueous solution of antimony chloride.

A large quantity of water or warm water is added to the aqueous solution of antimony trioxide or the aqueous solution obtained by the distillation thereof, and it is stirred at a temperature of preferably at least 90° C., as hereinbefore stated. This ensures the hydrolytic reaction of antimony chloride which does not involve any hydrochloric acid employed in an excessive quantity, and thereby the production of antimony trioxide of high purity. It is preferable to distill the aqueous antimony chloride solution prior to its hydrolysis in order to remove impurities therefrom almost completely. The aqueous solution resulting as a by-product and containing hydrochloric acid may be used as dilute hydrochloric acid, and if it is concentrated, it may be reused for the process of this invention.

The precipitated antimony trioxide is washed about twice with at least 10 times by weight as much water at a temperature of at least 60° C., as hereinbefore stated. This ensures the full removal of hydrochloric acid from the precipitate. The pulp containing the precipitate forms a cake upon filtration by an ordinary filter press or vacuum filter. If this cake is dried at 100° C., or preferably in a vacuum at a temperature of 60° C. to 80° C., it provides relatively coarse particles having an average particle size of three to five microns as determined by a sub-sieve sizer of Fisher Company U.S.A., and an alpha-ray strength not exceeding 0.01 C/cm$^2$ per hour. The distillation of the antimony chloride solution not only contributes to a further reduction in the alpha-ray strength of antimony trioxide, but also ensures the production of antimony trioxide which is superior in other respects, too. It contains not more than 1 ppm of impurities, such as arsenic, lead and soluble hydrochloric acid. Its solution in ethylene glycol leaves only a trace of undissolved matter. Its aqueous solution has an electric conductivity not exceeding 20 μmho/cm$^2$.

As is obvious from the foregoing description, the process of this invention enables the efficient production of antimony trioxide having a very low alpha-ray strength which is at least one-tenth that of any conventional product, a good color tone and a large average particle size. The process of this invention can also be used for producing antimony trioxide of good quality from an antimony chloride solution obtained by dissolving Sb$_2$O$_4$, Sb$_2$O$_5$ or metallic antimony in concentrated hydrochloric acid or chlorine gas. The use of these materials is, however, not recommended, since they are expensive, or complicate the process.

The invention will now be described more specifically with reference to a few examples thereof.

EXAMPLE 1

A reaction vessel having a capacity of six liters was charged with 2 kg of antimony trioxide having a purity of 99.6% by weight and an alpha-ray strength of 0.35 C/cm$^2$ per hour, and 5.5 liters of special grade 35% by weight concentrated hydrochloric acid were added thereto. They were stirred for 30 minutes at an ordinary ambient temperature to prepare an antimony trioxide solution. The undissolved matter was removed by a glass filter to yield 6.16 liters of an aqueous antimony chloride solution.

Then, 370 ml of the solution were taken in a 5-liter beaker, and five liters of distilled water were added thereto. The beaker was heated to, and held at, a temperature of 95° C. to 98° C. for an hour, while its contents were stirred by a propeller stirrer. The solution was, then, allowed to cool to an ambient temperature, and subjected to vacuum filtration by filter paper to form a cake. The cake was returned into the 5-liter beaker, and five liters of distilled water were added thereto. The beaker was held at a temperature of 95° C. to 98° C. for 30 minutes, while its contents were stirred by the stirrer, and the solution was subjected to vacuum filtration. These procedures were repeated twice. The resulting cake was dried at 70° C. in a vacuum for 24 hours to yield 110.1 g of antimony trioxide. This product had an alpha-ray strength of 0.008 C/cm$^2$ per hour as determined by a scintillation counter and an average particle size of 3.75 microns as determined by a sub-sieve sizer of Fisher Company. The product showed a yield of 92.0%.

EXAMPLE 2

A 5-liter distillation flask having a condenser was charged with 3.08 liters of the antimony chloride solution obtained in Example 1. It was distilled at a temperature controlled by a 700-watt mantle heater. With the lapse of two hours and ten minutes after the beginning of distillation, the temperature of the gaseous phase, which had been in the range of 105° C. to 110° C., began to rise sharply. When it had reached 135° C., the receptacle for collecting the distillate was changed to one for collecting antimony chloride. The temperature of the gaseous phase rose to 210° C., and the distillation was continued for 1.5 hours at a temperature of 210° C. to 212° C., so that the flask might be allowed for evaporation to dryness. During the distillation at a low temperature, the distillate was cooled with water for the recovery of hydrochloric acid and water, while the distillate obtained by distillation at a high temperature was not cooled, but its passage was held at a temperature of 75° C. to 80° C. to prevent solidification of the distillate.

The product of the high-temperature distillation was allowed to cool to yield 1.47 kg of the distillate. It was melted in a hot bath, and a 5-liter beaker was charged with 200 g of the molten distillate and five liters of distilled water. The procedures of Example 1 were thereafter repeated to yield 122.4 g of dry antimony trioxide. It showed an alpha-ray strength of 0.005 C/cm$^2$ per hour, did not contain more than 1 ppm of any of arsenic, lead or soluble chlorine, and had an average particle size of 4.3 microns as determined by the sub-sieve sizer already mentioned. The amount of the product meant a yield of 90.0%, and as the antimony trioxide existing in the undissolved residue from the first step of the process had been recovered separately, the production showed an overall yield of virtually 100%.

What is claimed is:

1. A process for purifying a sample of antimony trioxide which contains an alpha ray-producing contaminant substance so as to reduce the alpha ray strength of said sample, said process consisting of the steps of
    (a) mixing at least an equivalent amount of concentrated hydrochloric acid with said sample of antimony trioxide so as to form an aqueous solution of antimony chloride and an undissolved residue,
    (b) separating said undissolved residue from said aqueous solution of antimony chloride,
    (c) adding at least 10 times as much water by volume to said aqueous solution of antimony chloride to form a mixture,
    (d) heating said mixture to at least 60° C.,
    (e) stirring said heated mixture to cause antimony trioxide to precipitate, leaving a supernatent liquid,
    (f) separating said precipitated antimony trioxide from the supernatent liquid,
    (g) washing said separated antimony trioxide in at least one stage with at least 10 times as much warm water by weight, said warm water having a temperature of at least 60° C., and
    (h) drying said washed antimony trioxide to provide the purified antimony trioxide.

2. A process as defined in claim 1, wherein in step (a) said concentrated hydrochloric acid is mixed with said sample of antimony trioxide in an amount such that the aqueous solution of antimony trioxide contains at least 100 g of free hydrochloric acid per liter.

3. A process as defined in claim 1, wherein in step (c) at least 15 times as much water by weight is added to said aqeuous solution of antimony chloride.

4. A process as defined in claim 1, wherein in step (d) said mixture is heated to at least 90° C. and wherein in step (e) said heated mixture is stirred for about one hour.

5. A process as defined in claim 1, wherein in step (h) said washed antimony trioxide is subjected to a temperature of 100° C.

6. A process as defined in claim 1, wherein in step (h) said washed antimony trioxide is subjected to a vacuum at a temperature of between 60° C. and 80° C.

7. A process as defined in claim 1, wherein in step (g) said separated antimony trioxide is washed with said water in two separate stages.

8. A process for purifying a sample of antimony trioxide which contains an alpha ray-producing contaminant substance so as to reduce the alpha ray strength of said sample, said process consisting of the steps of
- (a) mixing at least an equivalent amount of concentrated hydrochloric acid with said sample of antimony trioxide so as to form an aqueous solution of antimony chloride and an undissolved residue,
- (b) separating said undissolved residue from said aqueous solution of antimony chloride,
- (c) distilling said aqueous solution of antimony chloride at a temperature of at least 35° C. and recovering the distillate,
- (d) adding at least 20 times as much water by volume to said distillate to form a mixture,
- (e) heating said mixture to at least 60° C.,
- (f) stirring said heated mixture to cause antimony trioxide to precipitate, leaving a supernatent liquid,
- (g) separating said precipitated antimony trioxide from the supernatent liquid,
- (h) washing said separated antimony trioxide in at least one stage with at least 10 times as much warm water by weight, said warm water having a temperature of at least 60° C., and
- (i) drying said washed antimony trioxide to provide the purified antimony trioxide.

9. A process as defined in claim 8, wherein in step (a) said concentrated hydrochloric acid is mixed with said sample of antimony trioxide in an amount such that the aqueous solution of antimony trioxide contains at least 100 g of free hydrochloric acid per liter.

10. A process as defined in claim 8, wherein in step (d) at least 25 times as much water by weight is added to said aqeuous solution of antimony chloride.

11. A process as defined in claim 8, wherein in step (e) said mixture is heated to at least 90° C. and wherein in step (f) said heated mixture is stirred for about one hour.

12. A process as defined in claim 8, wherein in step (i) said washed antimony trioxide is subjected to a temperature of 100° C.

13. A process as defined in claim 8, wherein in step (i) said washed antimony trioxide is subjected to a vacuum at a temperature of between 60° C. and 80° C.

14. A process as defined in claim 8, wherein in step (h) said separated antimony trioxide is washed with said water in two separate stages.

* * * * *